(12) United States Patent
Liao et al.

(10) Patent No.: US 11,756,884 B2
(45) Date of Patent: Sep. 12, 2023

(54) INTERCONNECTION STRUCTURE AND METHODS OF FORMING THE SAME

(71) Applicant: TAIWAN SEMICONDUCTOR MANUFACTURING COMPANY, LTD., Hsinchu (TW)

(72) Inventors: Wei-Hao Liao, Taichung (TW); Hsi-Wen Tien, Hsinchu (TW); Yu-Teng Dai, New Taipei (TW); Chih Wei Lu, Hsinchu (TW); Hsin-Chieh Yao, Hsinchu (TW); Chung-Ju Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/313,217

(22) Filed: May 6, 2021

(65) Prior Publication Data
US 2022/0359368 A1 Nov. 10, 2022

(51) Int. Cl.
*H01L 23/528* (2006.01)
*H01L 21/768* (2006.01)
*H01L 23/532* (2006.01)

(52) U.S. Cl.
CPC ...... *H01L 23/528* (2013.01); *H01L 21/76802* (2013.01); *H01L 23/53238* (2013.01); *H01L 23/53266* (2013.01); *H01L 21/76895* (2013.01)

(58) Field of Classification Search
CPC ............. H01L 23/528; H01L 21/76802; H01L 23/53238; H01L 23/53266; H01L 21/76841; H01L 21/7685; H01L 21/76834; H01L 21/76885; H01L 23/4824; H01L 21/0332; H01L 21/76895; H01L 23/4827
See application file for complete search history.

(56) References Cited

U.S. PATENT DOCUMENTS

| | | | |
|---|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |

(Continued)

*Primary Examiner* — Thanh T Nguyen
(74) *Attorney, Agent, or Firm* — NZ CARR LAW OFFICE

(57) ABSTRACT

An interconnect structure includes dielectric layer, a first conductive feature, a second conductive feature, a third conductive feature, and a dielectric fill. The first conductive feature is disposed in the dielectric layer. The second conductive feature is disposed over the first conductive feature. The second conductive feature includes a first conductive layer disposed over the first conductive feature, a second conductive layer disposed on the first conductive layer, and a third conductive layer disposed on the second conductive layer. The first conductive layer, the second conductive layer and the third conductive layer have substantially the same width. The third conductive feature is disposed over the dielectric layer. The dielectric fill is disposed over the dielectric layer between the second conductive feature and the third conductive feature.

20 Claims, 13 Drawing Sheets

(56) References Cited

U.S. PATENT DOCUMENTS

| | | | |
|---|---|---|---|
| 2020/0006217 A1* | 1/2020 | Hsieh | H01L 27/088 |
| 2020/0106008 A1* | 4/2020 | Peng | H10N 50/01 |
| 2021/0090899 A1* | 3/2021 | Liao | H01L 21/76885 |
| 2022/0102192 A1* | 3/2022 | Su | H01L 21/7682 |

* cited by examiner

INTERCONNECTION STRUCTURE AND METHODS OF FORMING THE SAME

BACKGROUND

Device scaling, which has driven the semiconductor technology for decades, increases not only transistor density, but also that of the metal interconnects. As the semiconductor industry introduces new generations of integrated circuits (ICs) with higher performance and more functions, the density of components forming the ICs has increased, while the dimensions, sizes, and spacing between components or elements have decreased.

The main purpose of continuous scaling of the device dimensions is to improve the performance of the semiconductor microprocessors and to pack more devices in the same area. However, as the technology node is advanced, the distances between metal contacts or metal lines become much shorter and the difficulty of the etching process to form the metal lines has also increased.

Therefore, there is a need in the art to provide improved structures and methods that can address the issues mentioned above.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
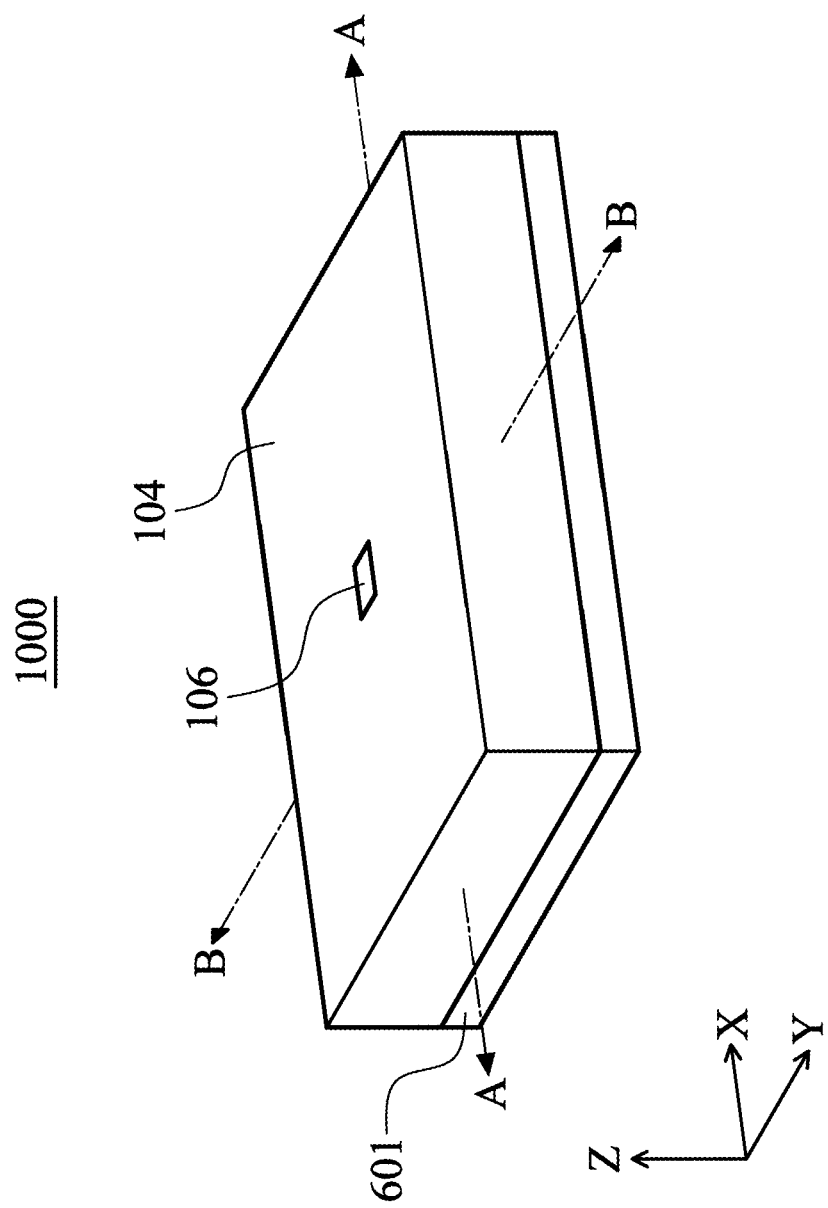
FIG. 1 is a perspective view of one of the various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a perspective view of one of the various stages of manufacturing a semiconductor device structure 100, in accordance with some embodiments. As shown in FIG. 1, the semiconductor device structure 100 includes a substrate 601 having at least a plurality of conductive features formed thereover (one conductive feature 106 is shown in FIG. 1). The conductive feature 106 is formed in a dielectric material 104. One or more devices (not shown), such as transistors, diodes, imaging sensors, resistors, capacitors, inductors, memory cells, a combination thereof, and/or other suitable devices, may be formed between the substrate 601 and the conductive feature 106.

FIGS. 2A-2B, 3A-3M, 4A-4B and 5A-5B show exemplary sequential processes for manufacturing a semiconductor device structure 100, in accordance with some embodiments. It is understood that additional operations can be provided before, during, and after processes shown by FIGS. 2A-2B, 3A-3M, 4A-4B and 5A-5B, and some of the operations described below can be replaced or eliminated, for additional embodiments of the process. The order of the operations/processes may be interchangeable.

Figures 2A, 2B:
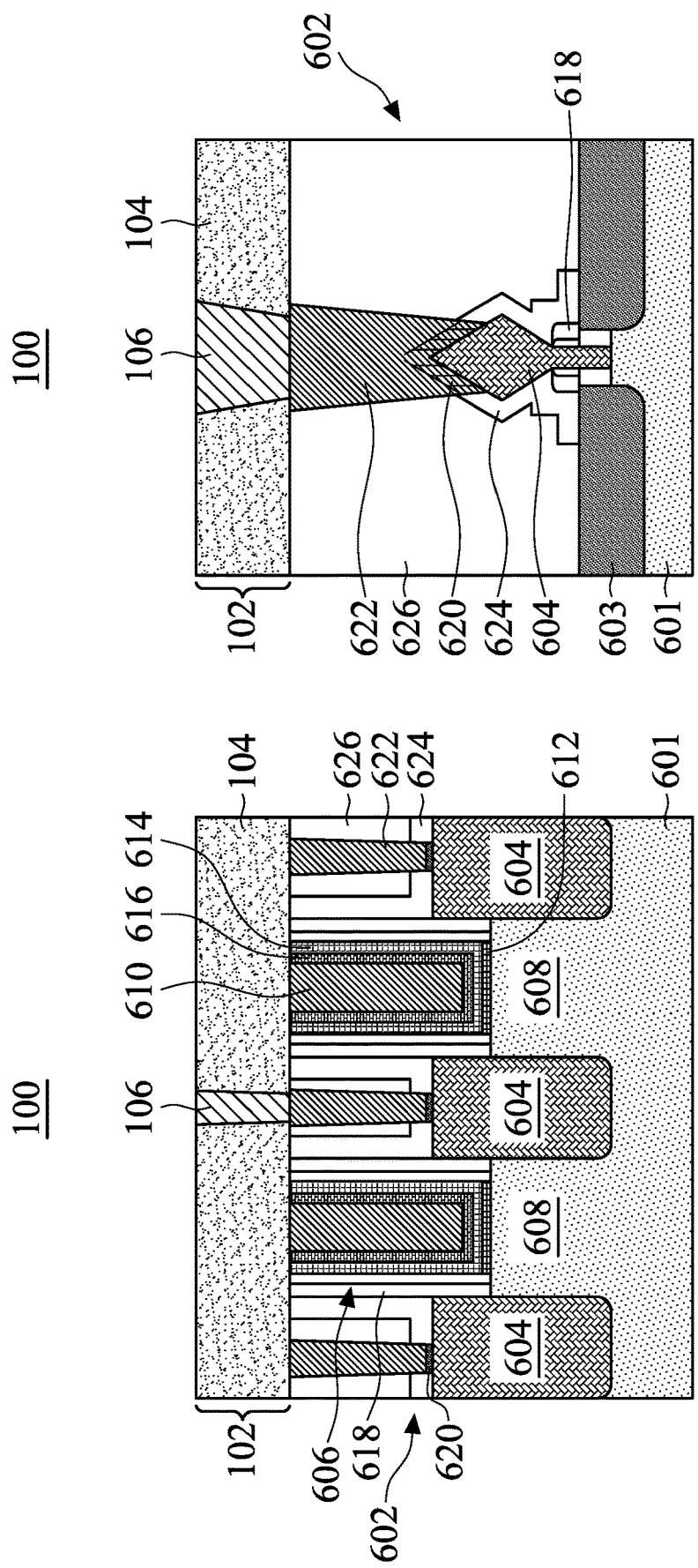
FIGS. 2A-2B are cross-sectional side views of various stages of manufacturing an interconnect structure, in accordance with some embodiments.

FIG. 2A is a cross-sectional side view of the semiconductor device structure 100 taken along line A-A of FIG. 1, and FIG. 2B is a cross-sectional side view of the semiconductor device structure 100 taken along line B-B of FIG. 1. The line A-A of FIG. 1 extends along a direction that is substantially perpendicular to the longitudinal direction of a gate stack 606, and the line B-B of FIG. 1 extends along the longitudinal direction of the gate stack 606. As shown in FIGS. 2A and 2B, the semiconductor device structure 100 includes the substrate 601, one or more devices 602 formed on the substrate 601, the dielectric material 104 formed over the devices 602, and the conductive features 106 formed in the dielectric material 104. The substrate 601 may be a semiconductor substrate. In some embodiments, the substrate 601 includes a single crystalline semiconductor layer on at least the surface of the substrate 601. The substrate 601 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). For example, the substrate 601 is made of Si. In some embodiments, the substrate 601 is a silicon-on-insulator (SOI) substrate, which includes an insulating layer (not shown) disposed between two silicon layers. In one aspect, the insulating layer is an oxygen-containing material, such as an oxide.

The substrate 601 may include one or more buffer layers (not shown) on the surface of the substrate 601. The buffer layers can serve to gradually change the lattice constant from that of the substrate to that of the source/drain regions. The buffer layers may be formed from epitaxially grown crystalline semiconductor materials such as, but not limited to Si, Ge, germanium tin (GeSn), SiGe, GaAs, InSb, GaP, GaSb, InAlAs, InGaAs, GaSbP, GaAsSb, GaN, GaP, and InP. In one embodiment, the substrate 601 includes SiGe buffer layers epitaxially grown on the silicon substrate 601. The germanium concentration of the SiGe buffer layers may increase from 30 atomic percent germanium for the bottom-most buffer layer to 70 atomic percent germanium for the top-most buffer layer.

The substrate 601 may include various regions that have been suitably doped with impurities (e.g., p-type or n-type impurities). The dopants are, for example phosphorus for an n-type fin field effect transistor (FinFET) and boron for a p-type FinFET.

As described above, the devices 602 may be any suitable devices, such as transistors, diodes, imaging sensors, resistors, capacitors, inductors, memory cells, or a combination thereof. In some embodiments, the devices 602 are transistors, such as planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding the channels. An example of the device 602 formed between the substrate 601 and the conductive features 106 is a FinFET, which is shown in FIGS. 2A and 2B. The device 602 includes source/drain (S/D) regions 604 and gate stacks 606. Each gate stack 606 may be disposed between S/D regions 604 serving as source regions and S/D regions 604 serving as drain regions. For example, each gate stack 606 may extend along the Y-axis between a plurality of S/D regions 604 serving as source regions and a plurality of S/D regions 604 serving as drain regions. As shown in FIG. 2A, two gate stacks 606 are formed on the substrate 601. In some embodiments, more than two gate stacks 606 are formed on the substrate 601. Channel regions 608 are formed between S/D regions 604 serving as source regions and S/D regions 604 serving as drain regions.

The S/D regions 604 may include a semiconductor material, such as Si or Ge, a III-V compound semiconductor, a II-VI compound semiconductor, or other suitable semiconductor material. Exemplary S/D region 604 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D regions 604 may include p-type dopants, such as boron; n-type dopants, such as phosphorus or arsenic; and/or other suitable dopants including combinations thereof. The S/D regions 604 may be formed by an epitaxial growth method using CVD, atomic layer deposition (ALD) or molecular beam epitaxy (MBE). The channel regions 608 may include one or more semiconductor materials, such as Si, Ge, GeSn, SiGe, GaAs, InSb, GaP, GaSb, InAlAs, InGaAs, GaSbP, GaAsSb, GaN, GaP, or InP. In some embodiments, the channel regions 608 include the same semiconductor material as the substrate 601. In some embodiments, the devices 602 are FinFETs, and the channel regions 608 are a plurality of fins disposed below the gate stacks 606. In some embodiments, the devices 602 are nanosheet transistors, and the channel regions 608 are surrounded by the gate stacks 606.

Each gate stack 606 includes a gate electrode layer 610 disposed over the channel region 608 (or surrounding the channel region 608 for nanostructure transistors). The gate electrode layer 610 may be a metal-containing material such as tungsten, cobalt, aluminum, ruthenium, copper, multilayers thereof, or the like, and can be deposited by ALD, plasma enhanced chemical vapor deposition (PECVD), MBD, physical vapor deposition (PVD), or any suitable deposition technique. Each gate stack 606 may include an interfacial dielectric layer 612, a gate dielectric layer 614 disposed on the interfacial dielectric layer 612, and one or more conformal layers 616 disposed on the gate dielectric layer 614. The gate electrode layer 610 may be disposed on the one or more conformal layers 616. The interfacial dielectric layer 612 may include a dielectric material, such as an oxygen-containing material or a nitrogen-containing material, or multilayers thereof, and may be formed by any suitable deposition method, such as CVD, PECVD, or ALD. The gate dielectric layer 614 may include a dielectric material such as an oxygen-containing material or a nitrogen-containing material, a high-k dielectric material having a k value greater than that of silicon dioxide, or multilayers thereof. The gate dielectric layer 614 may be formed by any suitable method, such as CVD, PECVD, or ALD. The one or more conformal layers 616 may include one or more barrier layers and/or capping layers, such as a nitrogen-containing material, for example tantalum nitride (TaN), titanium nitride (TiN), or the like. The one or more conformal layers 616 may further include one or more work-function layers, such as aluminum titanium carbide, aluminum titanium oxide, aluminum titanium nitride, or the like. The term "conformal" may be used herein for ease of description upon a layer having substantial same thickness over various regions. The one or more conformal layers 616 may be deposited by ALD, PECVD, MBD, or any suitable deposition technique.

Gate spacers 618 are formed along sidewalls of the gate stacks 606 (e.g., sidewalls of the gate dielectric layers 614). The gate spacers 618 may include silicon oxycarbide, silicon nitride, silicon oxynitride, silicon carbon nitride, the like, multi-layers thereof, or a combination thereof, and may be deposited by CVD, ALD, or other suitable deposition technique.

Portions of the gate stacks 606 and the gate spacers 618 may be formed on isolation regions 603. The isolation regions 603 are formed on the substrate 601. The isolation regions 603 may include an insulating material such as an oxygen-containing material, a nitrogen-containing material, or a combination thereof. The insulating material may be formed by a high-density plasma chemical vapor deposition (HDP-CVD), a flowable chemical vapor deposition (FCVD), or other suitable deposition process. In one aspect, the isolation regions 603 includes silicon oxide that is formed by a FCVD process.

A contact etch stop layer (CESL) 624 is formed on a portion of the S/D regions 604 and the isolation region 603, and a first interlayer dielectric (ILD) 626 is formed on the CESL 624. The CESL 624 can provide a mechanism to stop an etch process when forming openings in the first ILD 626. The CESL 624 may be conformally deposited on surfaces of the S/D regions 604 and the isolation regions 603. The CESL 624 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be deposited by CVD, PECVD, ALD, or any suitable deposition technique. The first ILD 626 may include an oxide formed by tetraethylorthosilicate (TEOS), undoped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than silicon dioxide), and may be deposited by spin-on, CVD, FCVD, PECVD, PVD, or any suitable deposition technique.

A silicide layer 620 is formed on at least a portion of each S/D region 604, as shown in FIGS. 2A and 2B. The silicide layer 620 may include a material having one or more of WSi, CoSi, NiSi, TiSi, MoSi and TaSi. In some embodiments, the silicide layer 620 includes a metal or metal alloy silicide, and the metal includes a noble metal, a refractory metal, a rare earth metal, alloys thereof, or combinations thereof. A conductive contact 622 is disposed on each silicide layer 620. The conductive contact 622 may include a material having one or more of Ru, Mo, Co, Ni. W, Ti, Ta, Cu, Al, TiN or TaN, and the conductive contact 622 may be formed by any suitable method, such as electro-chemical plating (ECP), or PVD. The silicide layer 620 and the conductive contact 622 may be formed by first forming an opening in the first ILD 626 and the CESL 624 to expose at least a portion of the S/D region 604, then forming the silicide layer 620 on the exposed portion of the S/D region 604, and then forming the conductive contact 622 on the silicide layer 620.

The dielectric material 104 may be formed over the devices 602, as shown in FIGS. 2A and 2B. The conductive features 106 are formed in the dielectric material 104, and each conductive feature 106 may be in contact with a corresponding conductive contact 622.

FIGS. 3A-3M are cross-sectional side views of various stages of manufacturing an interconnect structure 101 along line A-A of FIG. 1, in accordance with some embodiments. The interconnect structure 101 may be formed over various devices of a semiconductor device structure 100 shown in FIGS. 1, 2A and 2B. For example, the interconnect structure 101 may be formed over one or more devices, such as transistors, diodes, imaging sensors, resistors, capacitors, inductors, memory cells, combinations thereof, and/or other suitable devices. In some embodiments, the interconnect structure 101 may be formed over the transistors, such as nanostructure FET having a plurality of channels wrapped around by a gate electrode layer.

Figure 3B:
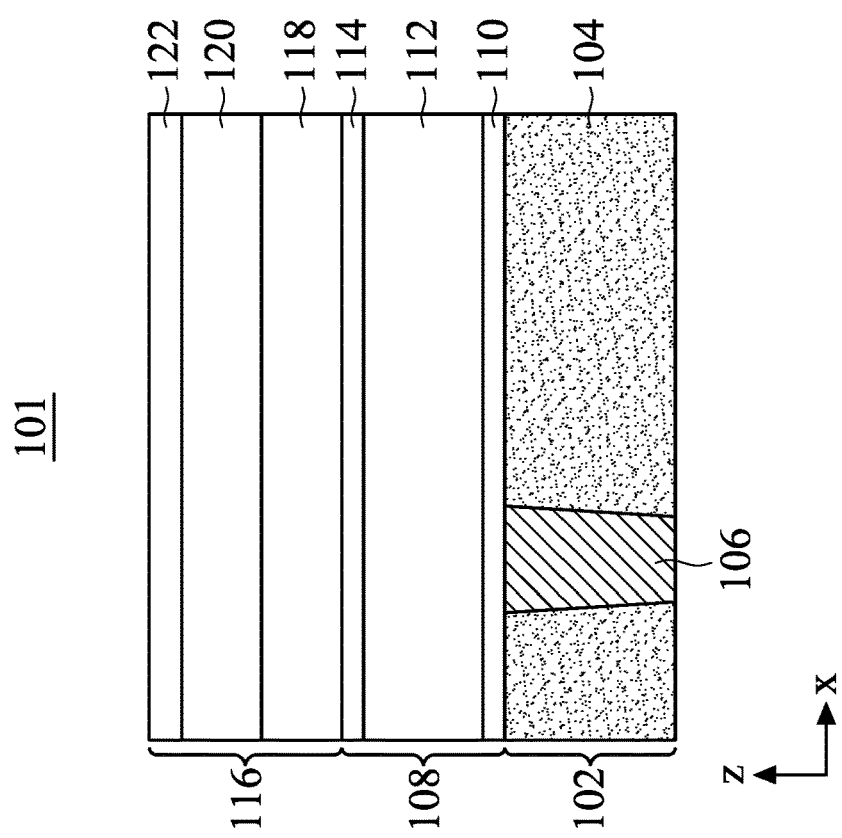
FIGS. 3A-3M are cross-sectional side views of various stages of manufacturing an interconnect structure, in accordance with some embodiments.
Figure 3A:
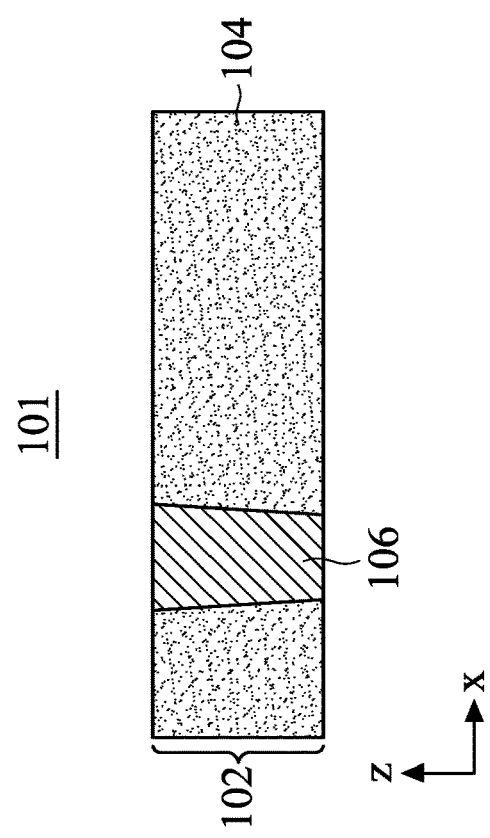

As shown in FIG. 3A, the interconnection structure 101 includes the dielectric layer 102, which may be an ILD layer or an intermetal dielectric (IMD) layer. The dielectric layer 102 includes the dielectric material 104, the one or more first conductive features 106 (one conductive feature is shown) disposed in the dielectric material 104, and an optional cap layer (not shown) disposed on each first conductive feature 106. In some embodiments, the dielectric material 104 includes silicon oxide. The dielectric material 104 may be formed by chemical vapor deposition (CVD), atomic layer deposition (ALD), spin coating, or other suitable process. The first conductive feature 106 may each include an electrically conductive material, such as Cu, Co, Ru, Mo, Cr, W, Mn, Rh, Ir, Ni, Pd, Pt, Ag, Au, Al, alloys thereof, or other suitable material. In some embodiments, the first conductive feature 106 and the cap layer each includes a metal. The first conductive feature 106 may be formed by physical vapor deposition (PVD), CVD, ALD, or other suitable process. The first conductive features 106 may be electrically connected to conductive contacts beneath the interconnection structure 101.

As shown in FIG. 3B, a conductive structure 108 is formed over the dielectric material 104 and the first conductive features 106. The conductive structure 108 may include a first conductive layer 110, a second conductive layer 112 and a third conductive layer 114. The first conductive layer 110 is a low electrical resistance material. In some embodiments, the first conductive layer 110 may include cobalt (Co), ruthenium (Ru), copper (Cu), chromium (Cr), titanium (Ti), vanadium (V), palladium (Pd), indium (In), alloys thereof, or other suitable material. In some embodiments, the first conductive layer 110 may be formed by PVD, ALD, or other suitable process under a process temperature between about 10° C. and 400° C. In some embodiments, the first conductive layer 110 may have a thickness ranging between about 10 Angstroms and 30 Angstroms.

The second conductive layer 112 is a low electrical resistance material. The second conductive layer 112 and the first conductive layer 110 include different materials. In some embodiments, the second conductive layer 112 may include tungsten (W), molybdenum (Mo), osmium (Os), iridium (Ir), cobalt (Co), niobium (Nb), platinum (Pt), rhodium (Rh), rhenium (Re), alloys thereof, or other suitable material. In some embodiments, the second conductive layer 112 may be formed by PVD, ALD, or other suitable process under a process temperature between about 10° C. and 400° C. In some embodiments, the second conductive layer 112 may have a thickness ranging between about 200 Angstroms and 500 Angstroms.

The third conductive layer 114 is a low electrical resistance material. The third conductive layer 114 and the second conductive layer 112 include different materials. In some embodiments, the third conductive layer 114 may include Ru, Cu, Cr, Ti, V, Pd, In, alloys thereof, or other suitable material. In some embodiments, the third conductive layer 114 may be formed by PVD, ALD, or other suitable process under a process temperature between about 10° C. and 400° C. In some embodiments, the third conductive layer 114 may have a thickness ranging between about 10 Angstroms and 80 Angstroms.

As shown in FIG. 3B, after forming the conductive structure 108, a hard mask structure 116 is formed on the conductive structure 108. The hard mask structure 116 includes a hard mask layer 118, a bottom layer 120, and a photoresist layer 122. In some embodiments, the hard mask layer 118 may include $SiO_2$, SiCN, Si, SiC, SiN, SiON, TiN, Al, $AlO_x$, $RuO_2$, or other suitable material. In some embodiments, the bottom layer 120 may include a carbon-based material. In some embodiments, the bottom layer 120 may include a carbon-containing material that is easily removed by a plasma operation. In some embodiments, the photoresist layer 122 is used to pattern the bottom layer 120. In some embodiments, the bottom layer 120 has a high etch selectivity to the hard mask layer 118. The hard mask structure 116, including the hard mask layer 118, the bottom layer 120 and the photoresist layer 122, allows the robust patterning of underlying layers.

Figure 3C:
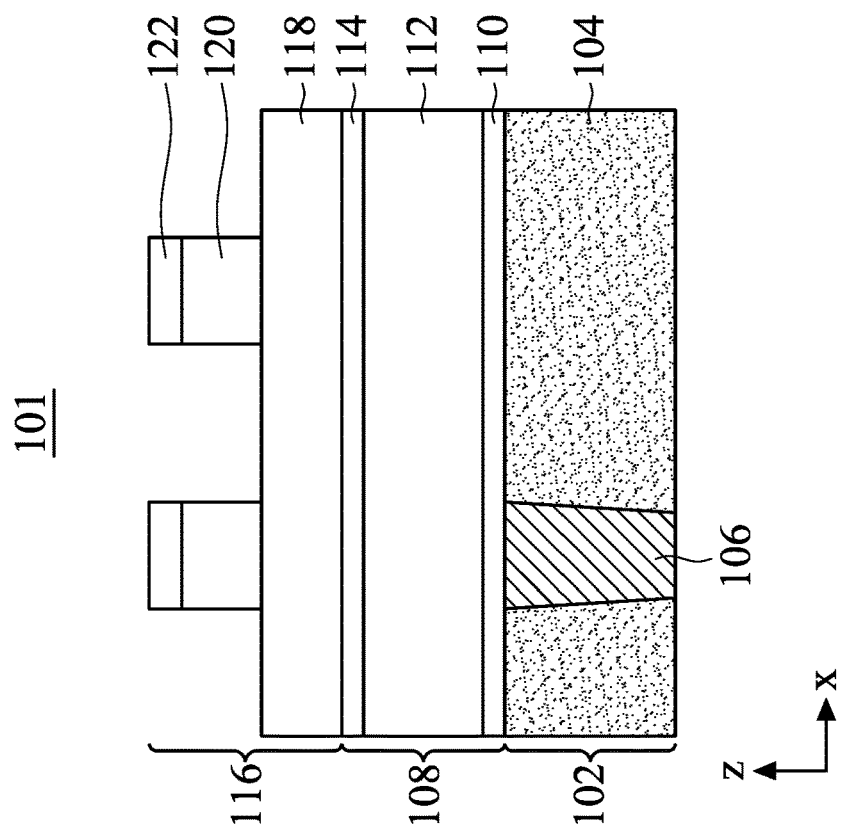

As shown in FIG. 3C, a patterning operation is performed on the photoresist layer 122. The photoresist layer 122 may be patterned using any suitable photolithography technique. For example, a photomask (not shown) may be disposed over the photoresist layer 122, which may then be exposed to a radiation beam including an ultraviolet (UV) or an excimer laser. In some embodiments, exposure of the photoresist layer 122 may be performed using an immersion lithography system to increase resolution and decrease the minimum achievable pitch. In some embodiments, a bake or cure operation may be performed to harden the photoresist layer 122, and a developer may be used to remove either the exposed or unexposed portions of the photoresist layer 122 depending on whether a positive or negative resist is used. In some embodiments, the hard mask structure 116 may further include anti-reflective materials (e.g., a backside anti-reflective coating (BARC) layer) to aid the exposure and focus of the photoresist layer 122.

Figure 3D:
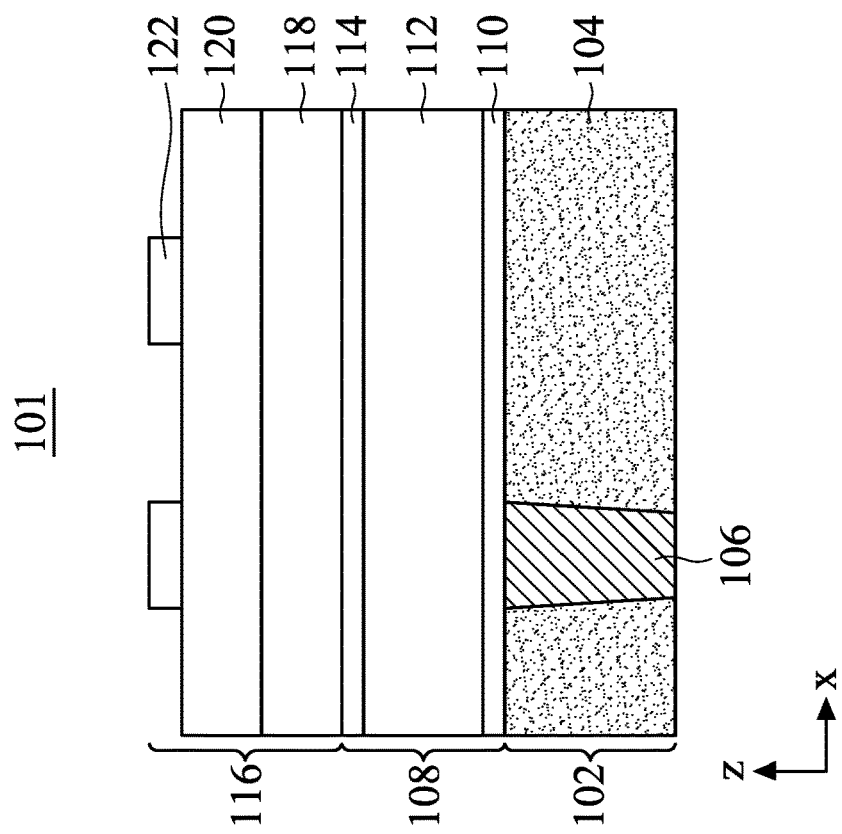

As shown in FIG. 3D, the patterned photoresist layer 122 is used to pattern the bottom layer 120, and the pattern of the photoresist layer 122 is transferred to the bottom layer 120. The pattern may be transferred, for example, by one or more selective etching processes. In some embodiments, the bottom layer 120 may be patterned by a dry etch process. Because the bottom layer 120 includes a carbon-based material, the bottom layer 120 is easily patterned by a dry etch process. In some embodiments, the bottom layer 120 may be patterned by a dry etch process using $Cl_2$, $SiCl_4$, $BCl_3$, $N_2$, $O_2$, $H_2$, HBr, He, Ar, or other suitable gas. In some embodiments, the dry etch process to pattern the bottom layer 120 may use a transformer-coupled plasma (TCP) operation with a power between about 100 watts to 1800 watts. In some embodiments, the dry etch process to pattern the bottom layer 120 may use a TCP operation with a bias voltage under 300 volts.

Figure 3F:
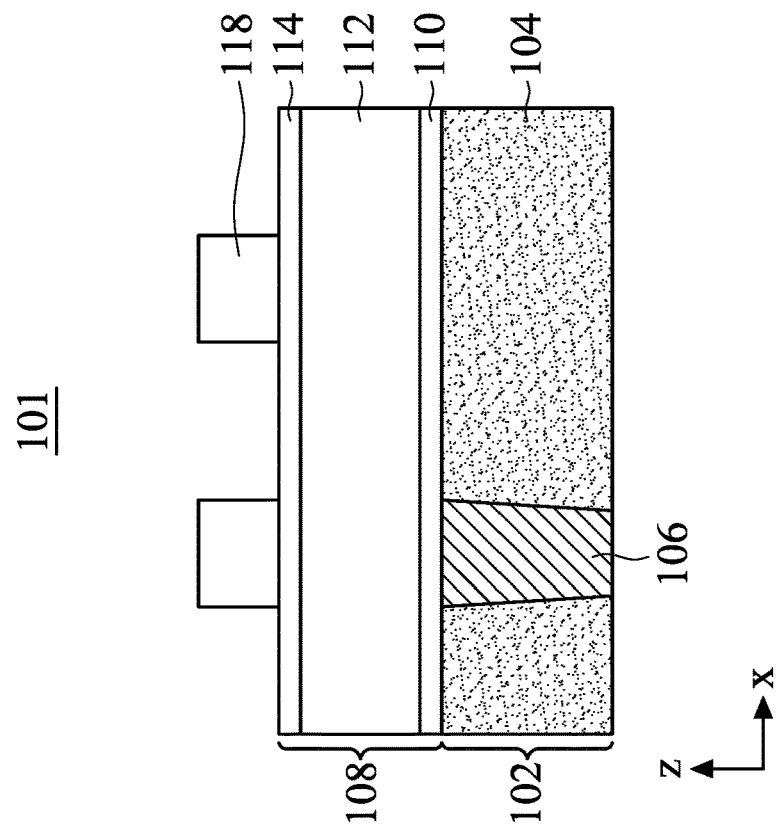
Figure 3E:
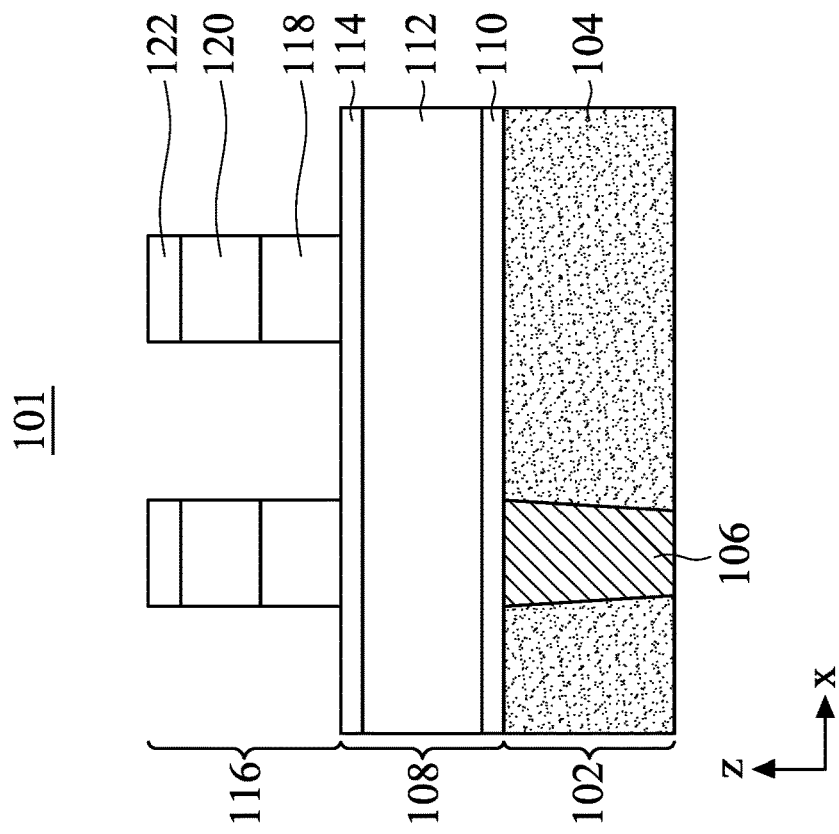

As shown in FIG. 3E, after patterning the bottom layer 120, the patterned bottom layer 120 is used to pattern the hard mask layer 118. The hard mask layer 118 may be patterned by a dry etch, a wet etch, or other suitable etch process. In some embodiments, the hard mask layer 118 may be patterned by a dry etch process using $CF_4$, $CHF_3$, $CH_3F$, $C_4F_8$, $C_4F_6$, $Cl_2$, $SiCl_4$, $BCl_3$, $N_2$, $O_2$, $H_2$, HBr, He, Ar, or other suitable gas. In some embodiments, the hard mask layer 118 may be patterned by a TCP operation with a power between about 100 watts to 2000 watts. In some embodiments, the hard mask layer 118 may be patterned by a TCP operation with a bias voltage under 800 volts. In some embodiments, the hard mask layer 118 may be patterned by a wet etch process using DI, $H_2O_2$, $H_2O$, HF, $H_2PO_4$, HCl, $CH_2CHOOH$, $H_2SO_4$, $HNO_3$, HF, dHF, or other suitable material. In some embodiments, the bottom layer 120 has a high etch selectivity to the hard mask layer 118.

As shown in FIG. 3F, after patterning the hard mask layer 118, the photoresist layer 122 and the bottom layer 120 are removed. The patterned hard mask layer 118 is then used to pattern the conductive structure 108. In some embodiments, when patterning the bottom layer 120, the bottom layer 120 has a high etch selectivity to the hard mask layer 118. In some embodiments, when patterning the hard mask layer 118, the hard mask layer 118 has a high etch selectivity to the third conductive layer 114.

Figure 3G:
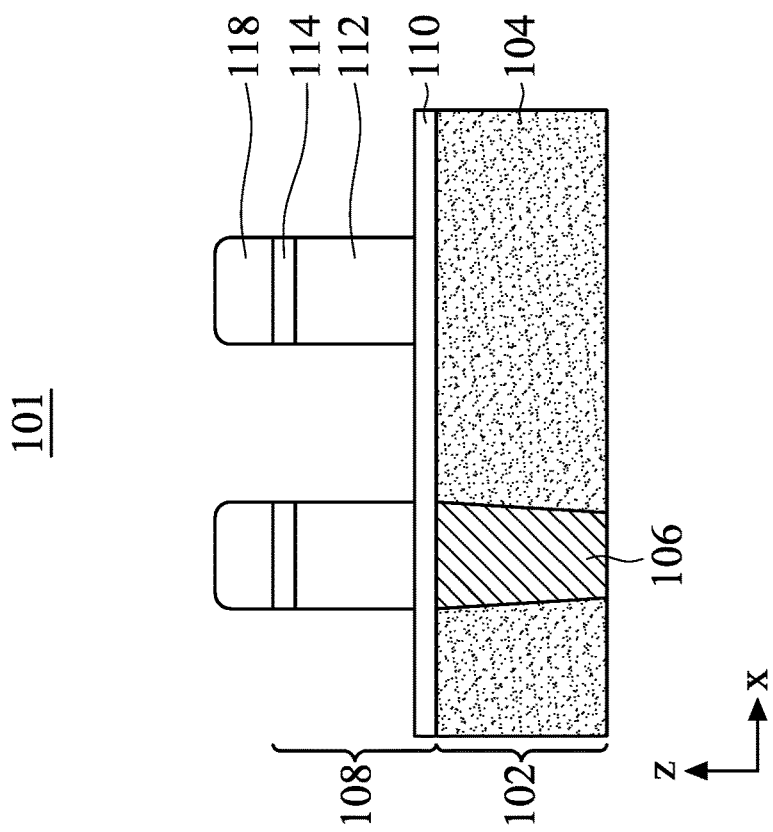

As shown in FIG. 3G, the hard mask layer 118 is then used to pattern the third conductive layer 114. The third conductive layer 114 may be patterned by a dry etch, a wet etch, or other suitable process. In some embodiments, the third conductive layer 114 may be patterned by a reactive-ion etching (RIE) process. In some embodiments, the third conductive layer 114 may be patterned by a dry etch process using chlorine based etching gas. In some embodiments, the third conductive layer 114 may be patterned by a dry etch process using $Cl_2$, $SiCl_4$, $BCl_3$, $N_2$, $O_2$, $H_2$, HBr, He, Ar, or other suitable gas. In some embodiments, the third conductive layer 114 may be patterned by a TCP operation with a power between about 100 watts to 1800 watts. In some embodiments, the third conductive layer 114 may be patterned by a TCP operation with a bias voltage under 300 volts. In some embodiments, when patterning the third conductive layer 114, the third conductive layer 114 has a high etch selectivity to the second conductive layer 112, and the third conductive layer 114 also has a high etch selectivity to the hard mask layer 118. In some embodiments, when patterning the third conductive layer 114, the third conductive layer 114 has an etch selectivity higher than 7 to the second conductive layer 112. In some embodiments, when patterning the third conductive layer 114, the third conductive layer 114 has an etch selectivity higher than 10 to the hard mask layer 118. As shown in FIG. 3G, after patterning the third conductive layer 114, a portion of the hard mask layer 118 is removed as well. Furthermore, because the third conductive layer 114 is thin and has a thickness ranging from about 10 Angstroms to about 80 Angstroms, over-etching of the third conductive layer 114 may be avoided. As a result, in combination with the etch selectivity between the second conductive layer 112 and the third conductive layer 114, the second conductive layer 112 may not be substantially affected by the patterning process of the third conductive layer 114.

Figure 3H:
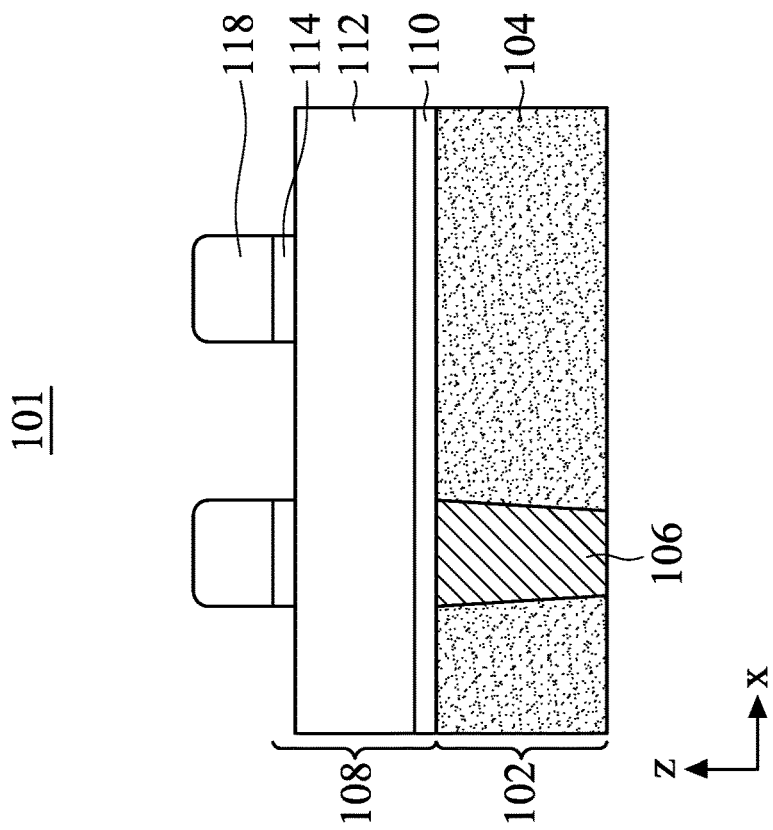

As shown in FIG. 3H, the hard mask layer 118 is then used to pattern the second conductive layer 112. The second conductive layer 112 may be patterned by a dry etch, a wet etch, or other suitable process. In some embodiments, the second conductive layer 112 may be patterned by a RIE process. In some embodiments, the second conductive layer 112 may be patterned by a dry etch process using fluorine based etching gas. In some embodiments, the second conductive layer 112 may be patterned by a dry etch process using $Cl_2$, $SiCl_4$, $BCl_3$, $CF_4$, $CHF_3$, $CH_3F$, $CH_2F_2$, $C_4F_8$, $C_4F_6$, $N_2$, $O_2$, $H_2$, HBr, He, Ar, or other suitable gas. In some embodiments, the second conductive layer 112 may be patterned by a TCP operation with a power between about 100 watts to 2000 watts. In some embodiments, the second conductive layer 112 may be patterned by a TCP operation with a bias voltage under 800 volts. In some embodiments, when patterning the second conductive layer 112, the second conductive layer 112 has a high etch selectivity to the first conductive layer 110, and the second conductive layer 112 also has a high etch selectivity to the hard mask layer 118. In some embodiments, when patterning the second conductive layer 112, the second conductive layer 112 has an etch selectivity higher than 8 to the first conductive layer 110. In some embodiments, when patterning the second conductive layer 112, the second conductive layer 112 has an etch selectivity higher than 5 to the hard mask layer 118. As shown in FIG. 3H, after patterning the second conductive layer 112, a further portion of the hard mask layer 118 is removed as well.

Figures 3I, 3J:
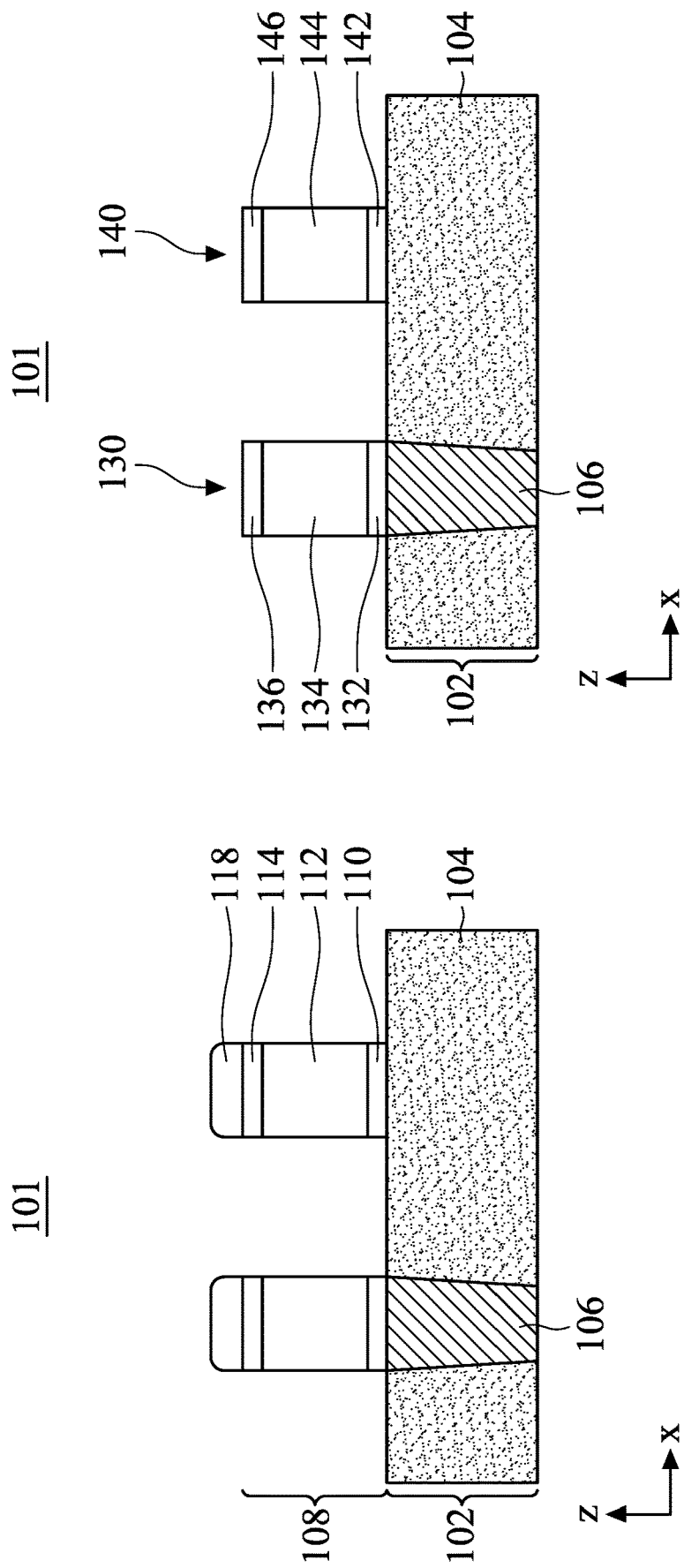

As shown in FIG. 3I, the hard mask layer 118 is then used to pattern the first conductive layer 110. The first conductive layer 110 may be patterned by a dry etch, a wet etch, or other suitable process. In some embodiments, the first conductive layer 110 may be patterned by a RIE process. In some embodiments, the first conductive layer 110 may be patterned by a dry etch process using $Cl_2$, $SiCl_4$, $BCl_3$, $N_2$, $O_2$, $H_2$, HBr, He, Ar, or other suitable gas. In some embodiments, the first conductive layer 110 may be patterned by a TCP operation with a power between about 100 watts to 1800 watts. In some embodiments, the first conductive layer 110 may be patterned by a TCP operation with a bias voltage under 300 volts. In some embodiments, when patterning the first conductive layer 110, the first conductive layer 110 has a high etch selectivity to the dielectric material 104 and the first conductive feature 106, and the first conductive layer 110 also has a high etch selectivity to the hard mask layer 118. In some embodiments, when patterning the first conductive layer 110, the first conductive layer 110 has an etch selectivity higher than 10 to the dielectric material 104. In some embodiments, when patterning the first conductive layer 110, the first conductive layer 110 has an etch selectivity higher than 8 to the hard mask layer 118. As shown in FIG. 3I, after patterning the first conductive layer 110, a further portion of the hard mask layer 118 is removed as well. Furthermore, because the first conductive layer 110 is thin and has a thickness ranging from about 10 Angstroms to about 30 Angstroms, over-etching of the first conductive layer 110 may be avoided. As a result, in combination with the etch selectivity between the first conductive layer 110 and the first conductive feature 106, the first conductive feature 106 may not be substantially affected by the patterning process of the first conductive layer 110.

As shown in FIG. 3J, the hard mask layer 118 is removed, and a second conductive feature 130 and a third conductive feature 140 are formed on the layer 102. The second conductive feature 130 is formed over the first conductive feature 106, and third conductive feature 140 is formed over the dielectric material 104. The second conductive feature 130 includes a conductive layer 132, a conductive layer 134 and a conductive layer 136 stacking over the first conductive feature 106. The third conductive feature 140 includes a conductive layer 142, a conductive layer 144 and a conductive layer 146 stacking over the dielectric material 104. Since the second conductive feature 130 and the third conductive feature 140 are formed together from the conductive structure 108, the conductive layer 132 has the same material with the conductive layer 142, the conductive layer 134 has the same material with the conductive layer 144, and the conductive layer 136 has the same material with the conductive layer 146. Furthermore, the conductive layer 132, the conductive layer 134 and the conductive layer 136 have substantially the same width, and the conductive layer 142, the conductive layer 144 and the conductive layer 146 have substantially the same width.

Because the second conductive feature 130 and the third conductive feature 140 have similar structures, the second conductive feature 130 is used to explain the characteristics of the second conductive feature 130 and the third conductive feature 140 below.

As described above, in some embodiments, the first conductive layer 110 may have a thickness ranging between about 10 Angstroms to 30 Angstroms, the second conductive layer 112 may have a thickness ranging between about 200 Angstroms to 500 Angstroms, and the third conductive layer 114 may have a thickness ranging between about 10 Angstroms to 80 Angstroms. Hence, in some embodiments, the conductive layer 132 may have a thickness ranging between about 10 Angstroms to 30 Angstroms, the conductive layer 134 may have a thickness ranging between about 200 Angstroms to 500 Angstroms, and the conductive layer 136 may have a thickness ranging between about 10 Angstroms to 80 Angstroms.

By forming first conductive layer 110 under the second conductive layer 112, the first conductive layer 110 may perform as an etch stop layer when patterning the second conductive layer 112. Because the second conductive layer 112 has a high etch selectivity to the first conductive layer 110 when patterning the second conductive layer 112, and the first conductive layer 110 has a high etch selectivity to the dielectric material 104 and the first conductive feature 106 when patterning the first conductive layer 110, the first conductive layer 110 may prevent the damage to the dielectric material 104 and the first conductive feature 106 when forming the second conductive feature 130 and the third conductive feature 140. Furthermore, the via damage of the first conductive feature 106 caused by the oxide recess of the dielectric material 104 may be also prevented.

If the conductive layer 132 (the first conductive layer 110) is too thin, such as less than about 10 Angstroms, the conductive layer 132 may not provide sufficient protection to the dielectric material 104 and the first conductive feature 106 when forming the second conductive feature 130 and the third conductive feature 140. If the conductive layer 132 is too thick, such as greater than about 30 Angstroms, the patterning process forming the conductive layer 132 may also damage the first conductive feature 106, and the electrical properties (e.g., conductivity) of the second conductive feature 130 and the third conductive feature 140 may be worsened. Therefore, in some embodiments, the conductive layer 132 may have a thickness ranging between about 10 Angstroms to 30 Angstroms, and a thickness of the conductive layer 132 is about 3% to 8% of a total thickness of the second conductive feature 130. Similarly, if the thickness of the conductive layer 132 is less than about 3% of the total thickness of the second conductive feature 130, the conductive layer 132 may not provide sufficient protection to the dielectric material 104 and the first conductive feature 106. On the other hand, if the thickness of the conductive layer 132 is greater than about 8% of the total thickness of the second conductive feature 130, the patterning process forming the conductive layer 132 may also damage the first conductive feature 106, and the electrical properties (e.g., conductivity) of the second conductive feature 130 and the third conductive feature 140 may be worsened.

Because the etch selectivity of second conductive layer 112 to the hard mask layer 118 is insufficient, in a situation that patterning the second conductive layer 112 without the third conductive layer 114, the second conductive layer 112 may be damaged and the metal lines formed by the second conductive feature 130 and the third conductive feature 140 may be broken. By forming the third conductive layer 114 above the second conductive layer 112, the third conductive layer 114 may provide a protection to the second conductive layer 112 when patterning the second conductive layer 112.

If the conductive layer 136 (the third conductive layer 114) is too thin, the conductive layer 136 may not provide sufficient protection to the conductive layer 134 (the second conductive layer 112) when forming the second conductive feature 130 and the third conductive feature 140. If the conductive layer 136 is too thick, the patterning process forming the conductive layer 136 may also damage the conductive layer 134, and the electrical properties (e.g., conductivity) of the second conductive feature 130 and the third conductive feature 140 may be worsened. Therefore, in some embodiments, the conductive layer 136 may have a thickness ranging between about 10 Angstroms to 80 Angstroms, and a thickness of the conductive layer 136 is about 5% to 15% of a total thickness of the second conductive feature 130. Similarly, if the thickness of the conductive layer 136 is less than about 5% of the total thickness of the second conductive feature 130, the conductive layer 136 may not provide sufficient protection to the conductive layer 134. On the other hand, if the thickness of the conductive layer 136 is greater than about 15% of the total thickness of the second conductive feature 130, the patterning process forming the conductive layer 136 may also damage the conductive layer 134, and the electrical properties (e.g., conductivity) of the second conductive feature 130 and the third conductive feature 140 may be worsened.

Figure 3L:
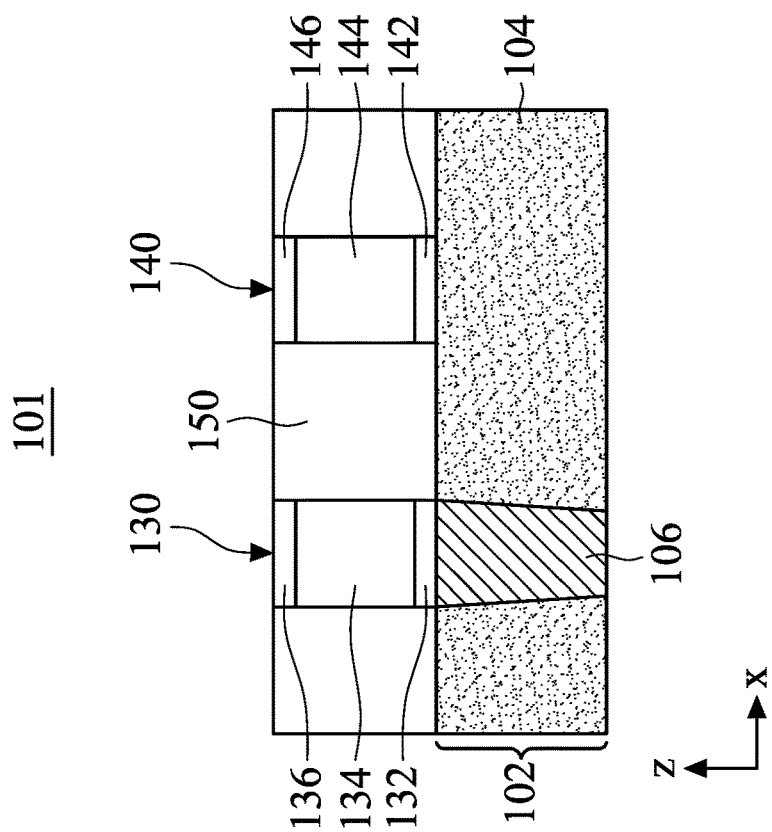
Figure 3K:
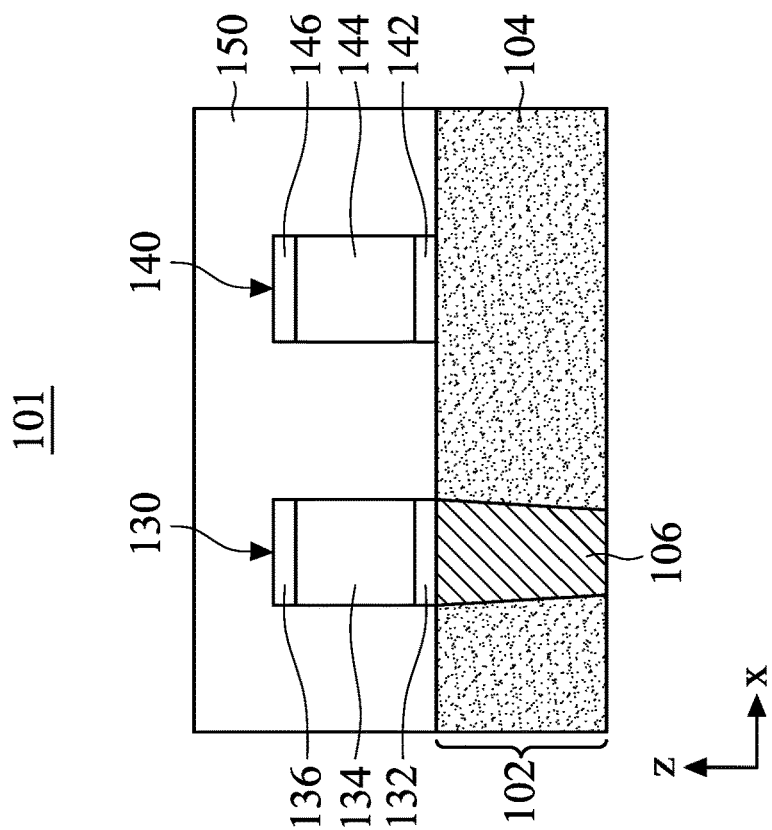

As shown in FIG. 3K, a dielectric fill 150 is disposed over the dielectric layer 102, the second conductive feature 130 and the third conductive feature 140.

The dielectric fill 150 may be a silicon-containing material, such as SiCO, SiCN, SiN, SiCON, SiO$_x$, SiC, SiCOH, or SiON. In some embodiments, the dielectric fill 150 includes a low-k dielectric material having a k value ranging from about 2 to about 3.6, such as SiCOH. The low-k dielectric material may have a porosity ranging from about 0.1 percent to about 40 percent. The dielectric fill 150 may fill the space over the dielectric layer 102 between the second conductive feature 130 and the third conductive feature 140. The dielectric fill 150 may also cover the second conductive feature 130 and the third conductive feature 140. The dielectric fill 150 may be formed by CVD, ALD, PECVD, PEALD, or other suitable process.

In some embodiments, before forming the dielectric fill 150, a capping layer (not shown) may be formed on the exposed surfaces of the dielectric material 104, the second conductive feature 130 and the third conductive feature 140. The capping layer may prevent metal diffusion from the second conductive feature 130 and the third conductive feature 140 to the dielectric fill 150. The capping layer may be made of a dielectric material. In some embodiments, the capping layer includes SiCO, SiCN, SiN, SiCON, SiO$_x$, SiC, SiON, or other suitable dielectric materials. The capping layer may be formed by any suitable process, such as PVD, ALD, CVD, PECVD, PEALD or any suitable conformal process. The capping layer may have a thickness ranging from about 5 Angstroms to about 200 Angstroms.

As shown in FIG. 3L, a planarization process may be performed to remove a portion of the dielectric fill 150. In some embodiments, the planarization process may also remove a portion of the conductive layer 136 and a portion of the conductive layer 146. The planarization process may be any suitable process, such as a chemical-mechanical polishing (CMP) process. As a result of the planarization process, a top surface of the dielectric fill 150, the second conductive feature 130 and the third conductive feature 140 may be substantially co-planar.

Figure 3M:
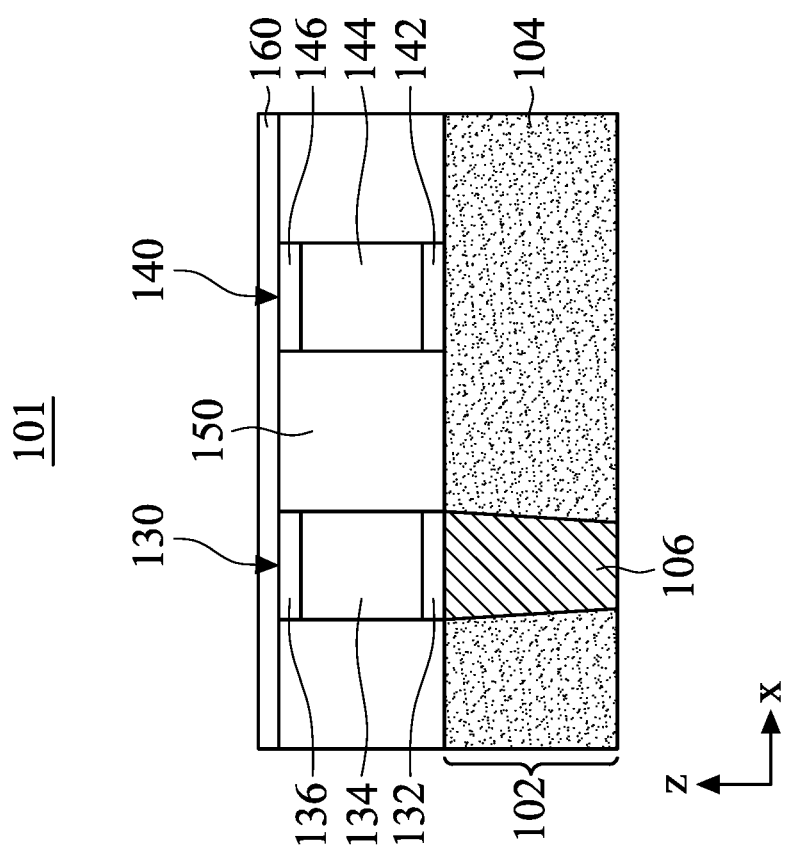

Then, as shown in FIG. 3M, an etch stop layer 160 may be formed on the dielectric fill 150, the second conductive feature 130 and the third conductive feature 140. The etch stop layer 160 is formed on the planar surfaces of the dielectric fill 150, the second conductive feature 130 and the third conductive feature 140. The etch stop layer 160 may be a single layer or a multi-layer structure. The etch stop layer 160 may include a metal oxide, such as Al, Zr, Y, Hf, or other suitable metal oxide, or a silicon-containing material, such as SiCO, SiCN, SiN, SiCON, SiO$_x$, SiC, SiON, or the like. The etch stop layer 160 may be formed by PVD, CVD, ALD, spin-on, or any suitable deposition process. The etch stop layer 160 may have a thickness ranging from about 1 Angstrom to about 100 Angstroms.

Figure 4A:
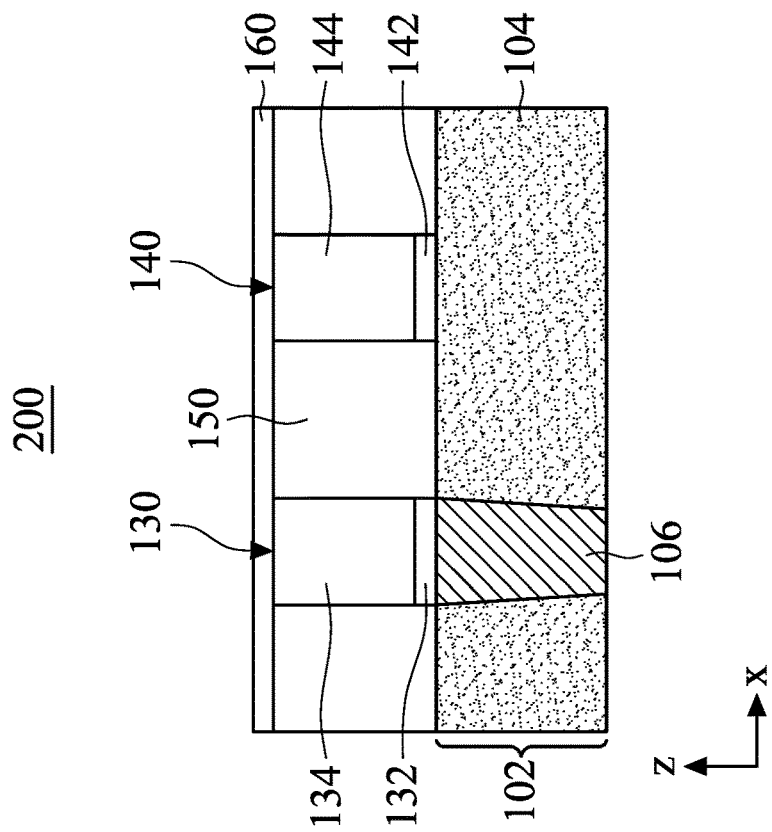
FIGS. 4A-4B are cross-sectional side views of various stages of manufacturing another interconnect structure, in accordance with some embodiments.
Figure 4B:
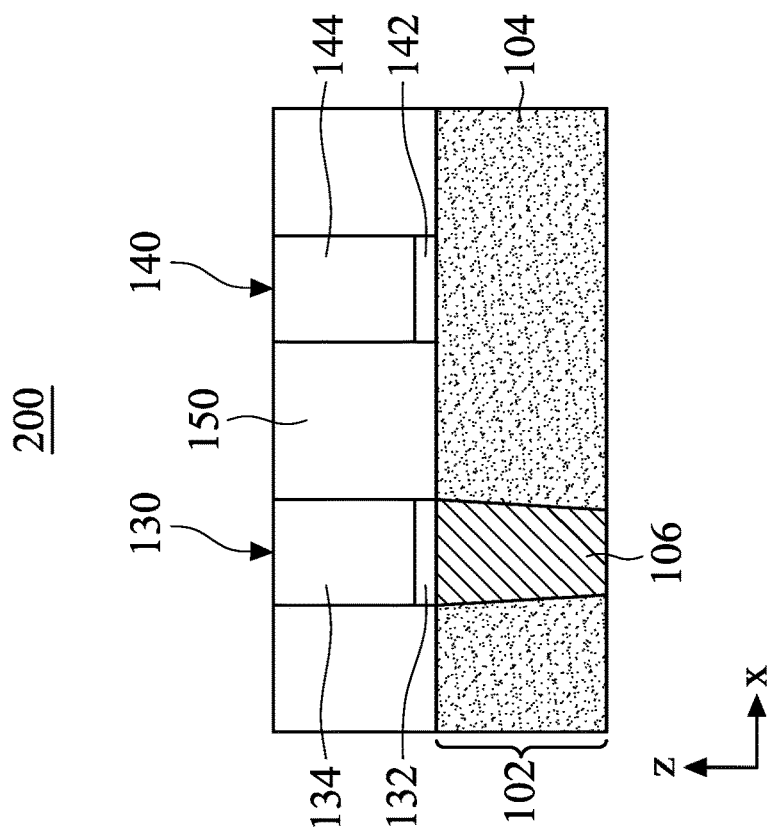

FIGS. 4A-4B are cross-sectional side views of various stages of manufacturing an interconnect structure 200, in accordance with some embodiments. The interconnect structure 200 is similar to the interconnect structure 101 in FIGS. 3A-3M. However, as shown in FIG. 4A, the second conductive feature 130 may include the conductive layer 132 and the conductive layer 134, and the third conductive feature 140 may include the conductive layer 142 and the conductive layer 144. In other words, the second conductive feature 130 and the third conductive feature 140 in the interconnect structure 200 are two-layer structures.

In some embodiments, in the planarization process shown in FIG. 3L, the planarization process may remove a portion of the dielectric fill 150, and further remove all the conductive layer 136 and all the conductive layer 146 to expose the conductive layer 134 and the conductive layer 144. As a result of the planarization process, a top surface of the dielectric fill 150, the conductive layer 134 and the conductive layer 144 may be substantially co-planar.

Then, as shown in FIG. 4B, the etch stop layer 160 may be formed on the dielectric fill 150, the second conductive feature 130 and the third conductive feature 140. The etch stop layer 160 is formed on the planar surfaces of the dielectric fill 150, the conductive layer 134 and the conductive layer 144.

Because the function of the conductive layer 136 and the conductive layer 146 (the third conductive layer 114 in FIGS. 3B-3I) is to provide a protection to the second conductive layer 112 when patterning the second conductive layer 112. During the planarization process shown in FIG. 3L, the patterning process of the second conductive layer 112 is completed, and therefore the conductive layer 136 and the conductive layer 146 may be optionally removed.

In another embodiment, when the design of the interconnect structure 200 provides a protection to prevent the damage to the dielectric material 104 and the first conductive feature 106 when forming the second conductive feature 130 and the third conductive feature 140, the conductive structure 108 may be a two-layer structure including the first conductive layer 110 and the second conductive layer 112. In this situation, after forming the second conductive feature 130 and the third conductive feature 140, the second conductive feature 130 and the third conductive feature 140 in the interconnect structure 200 are two-layer structures, and the third conductive layer 114 (the conductive layers 136, 146) is not present.

Figure 5B:
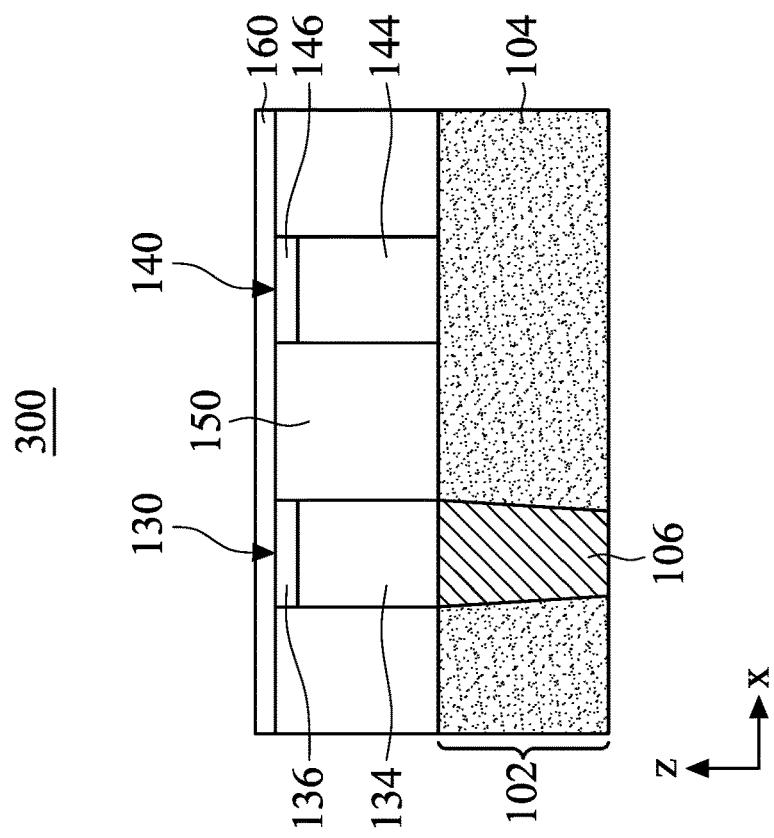
FIGS. 5A-5B are cross-sectional side views of various stages of manufacturing a further interconnect structure, in accordance with some embodiments.
Figure 5A:
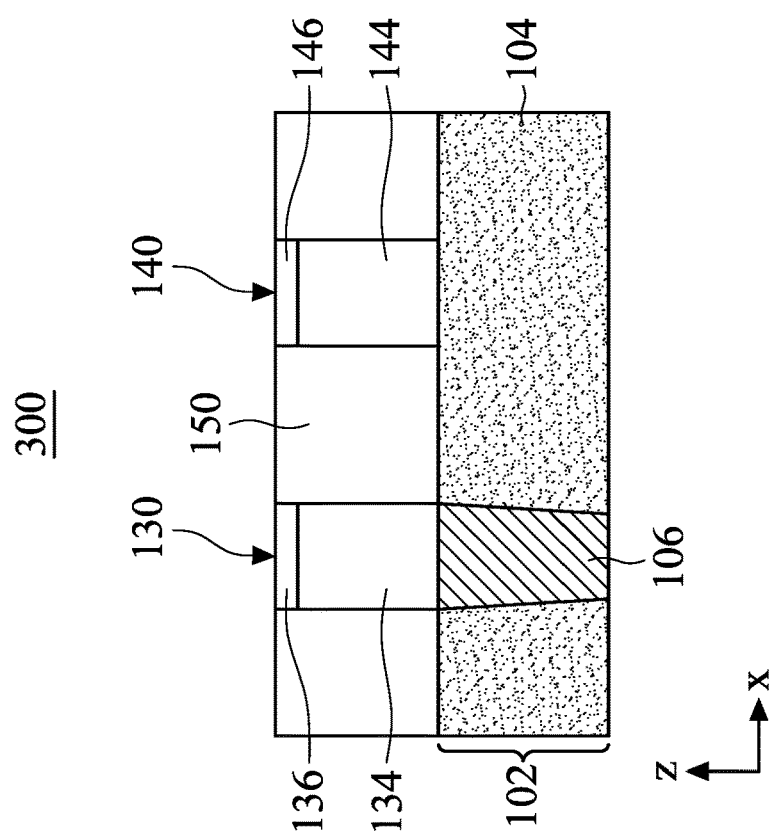

FIGS. 5A-5B are cross-sectional side views of various stages of manufacturing an interconnect structure 300, in accordance with some embodiments. The interconnect structure 300 is similar to the interconnect structure 101 in FIGS. 3A-3M. However, as shown in FIG. 5A, the second conductive feature 130 may include the conductive layer 134 and the conductive layer 136, and the third conductive feature 140 may include the conductive layer 144 and the conductive layer 146. In other words, the second conductive feature 130 and the third conductive feature 140 in the interconnect structure 300 are two-layer structures, and the conductive layers 132, 142 are not present.

In some embodiments, when the design of the interconnect structure 300 provides a protection to the second conductive layer 112 when patterning the first conductive layer 110 to prevent the damage to the metal lines formed by the second conductive feature 130 and the third conductive feature 140, the conductive structure 108 may be a two-layer structure including the second conductive layer 112 and the third conductive layer 114. Then, after the planarization process, as shown in FIG. 5A, a top surface of the dielectric fill 150, the conductive layer 136 and the conductive layer 146 may be substantially co-planar.

Then, as shown in FIG. 5B, the etch stop layer 160 may be formed on the dielectric fill 150, the second conductive feature 130 and the third conductive feature 140. The etch stop layer 160 is formed on the planar surfaces of the dielectric fill 150, the conductive layer 136 and the conductive layer 146.

Figure 6:
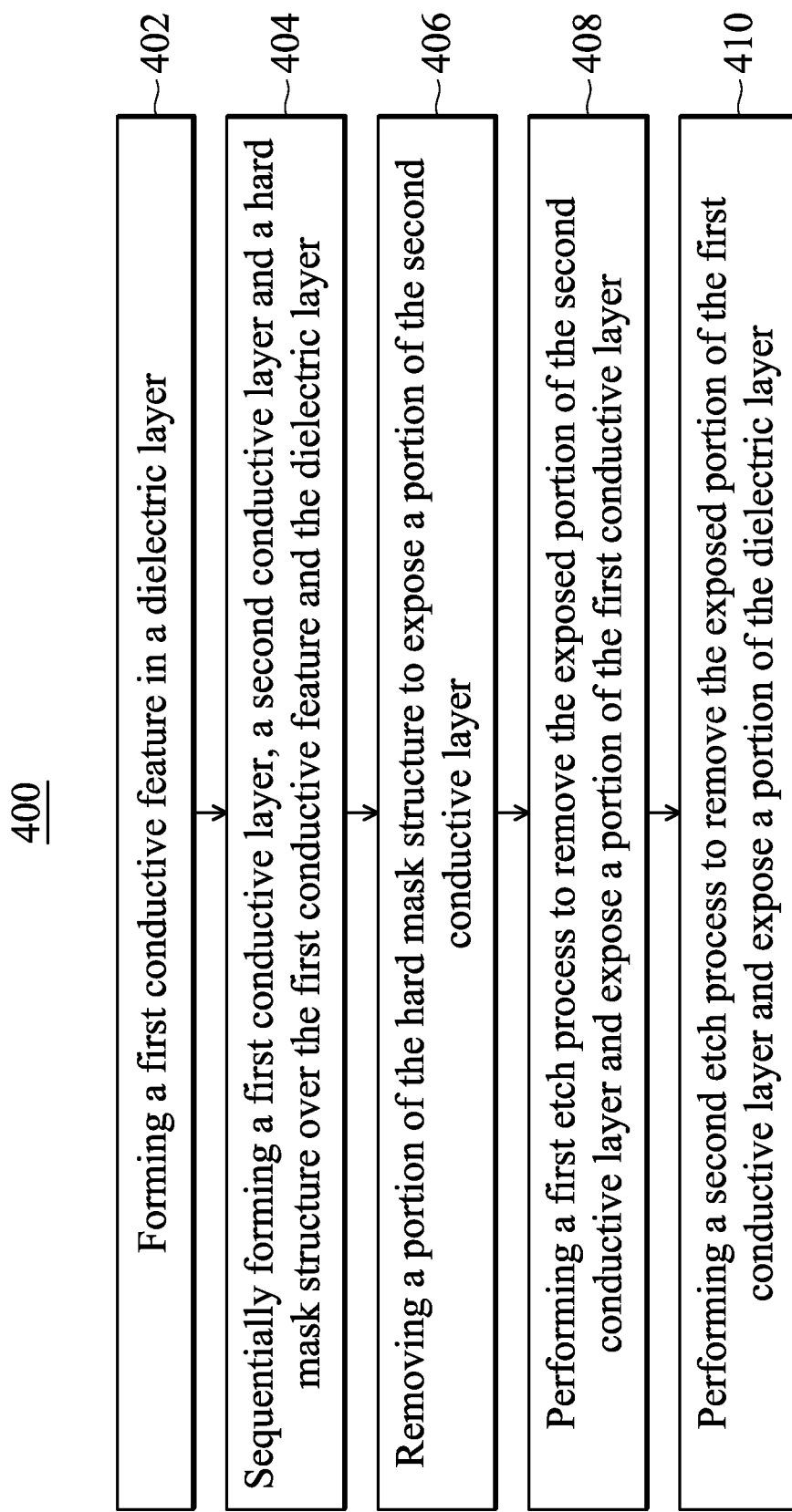
FIG. 6 is a flow chart of a method of manufacturing an interconnect structure in accordance with some embodiments.

FIG. 6 is a flow chart of a method 400 of manufacturing the interconnect structure 200 or the interconnect structure 300 in accordance with some embodiments. It is noted that the operations of the method 400, including any descriptions given with reference to the figures, are merely exemplary and are not intended to be limiting beyond what is specifically recited in the claims that follow. Additional operations may be implemented before, during, and after the method 400, and some operations may be replaced, eliminated, or rearranged in any desired order in accordance with various embodiments of the method 400.

The method 400 starts at operation 402 by forming a first conductive feature in a dielectric layer. The first conductive feature may be the conductive feature 106 and the dielectric layer may be the dielectric material 104. The first conductive feature and the dielectric layer may be formed by the processes discussed above with respect to FIG. 3A.

At operation 404, a first conductive layer, a second conductive layer and a hard mask structure are sequentially formed over the first conductive feature and the dielectric layer. The first conductive layer and the second conductive layer may be formed by PVD, ALD, or other suitable process.

When forming the interconnect structure 200, the first conductive layer and the second conductive layer may be the first conductive layer 110 and the second conductive layer 112. When forming the interconnect structure 200, the first conductive layer may be formed by Co, Ru, Cu, Cr, Ti, V, Pd, In, alloys thereof, or other suitable material. When forming the interconnect structure 200, the second conductive layer may be formed by W, Mo, Os, Ir, Co, Nb, Pt, Rh, Re, alloys thereof, or other suitable material.

When forming the interconnect structure 300, the first conductive layer and the second conductive layer may be the second conductive layer 112 and the third conductive layer 114. When forming the interconnect structure 300, the first conductive layer may be formed by W, Mo, Os, Ir, Co, Nb, Pt, Rh, Re, alloys thereof, or other suitable material. When forming the interconnect structure 300, the second conductive layer may be formed by Ru, Cu, Cr, Ti, V, Pd, In, alloys thereof, or other suitable material.

The hard mask structure may be the hard mask structure 116. The hard mask structure may include a hard mask layer, a bottom layer, and a photoresist layer. In some embodiments, the hard mask layer, the bottom layer, and the photoresist layer may be the hard mask layer 118, the bottom layer 120, and the photoresist layer 122.

In some embodiments, the hard mask layer may include $SiO_2$, SiCN, Si, SiC, SiN, SiON, TiN, Al, $AlO_x$, $RuO_2$, or other suitable material. In some embodiments, the bottom layer may include a carbon-based material. In some embodiments, the bottom layer may include a carbon-containing material that is easily removed by a plasma operation. In some embodiments, the photoresist layer is used to pattern the bottom layer. In some embodiments, the bottom layer has a high etch selectivity to the hard mask layer. The hard mask structure, including the hard mask layer, the bottom layer, and the photoresist layer, allows the robust patterning of underlying layers.

At operation 406, a portion of the hard mask structure is removed to expose a portion of the second conductive layer. The removal of the portion of the hard mask structure may include multiple operations.

A patterning operation is first performed on the photoresist layer. The photoresist layer may be patterned using any suitable photolithography technique. In some embodiments, a bake or cure operation may be performed to harden the photoresist layer, and a developer may be used to remove either the exposed or unexposed portions of the photoresist layer depending on whether a positive or negative resist is used. In some embodiments, the hard mask structure may further include anti-reflective materials (e.g., a BARC layer) to aid the exposure and focus of the photoresist layer. Then, the photoresist layer is used to pattern the bottom layer, and the pattern of the photoresist layer is transferred to the bottom layer. The pattern may be transferred, for example, by one or more selective etching processes. After patterning the bottom layer, the bottom layer is used to pattern the hard mask layer. The hard mask layer may be patterned by a dry etch, a wet etch, or other suitable etch process. In some embodiments, the bottom layer has a high etch selectivity to the hard mask layer. After patterning the hard mask layer, the photoresist layer and the bottom layer are removed.

At operation 408, a first etch process is performed to remove the exposed portion of the second conductive layer and expose a portion of the first conductive layer. The first etch process may be a dry etch, a wet etch, or other suitable process. The first etch process may be a RIE process.

When forming the interconnect structure 200, the first etch process may be a dry etch process using $Cl_2$, $SiCl_4$, $BCl_3$, $CF_4$, $CHF_3$, $CH_3F$, $CH_2F_2$, $C_4F_8$, $C_4F_6$, $N_2$, $O_2$, $H_2$, HBr, He, Ar, or other suitable gas. When forming the interconnect structure 200, the first etch process may be a TCP operation with a power between about 100 watts to 2000 watts. When forming the interconnect structure 200, the first etch process may be a TCP operation with a bias voltage under 800 volts.

When forming the interconnect structure 300, the first etch process may be a dry etch process using $Cl_2$, $SiCl_4$, $BCl_3$, $N_2$, $O_2$, $H_2$, HBr, He, Ar, or other suitable gas. When forming the interconnect structure 300, the first etch process may be a TCP operation with a power between about 100 watts to 1800 watts. When forming the interconnect structure 300, the first etch process may be a TCP operation with a bias voltage under 300 volts.

At operation 410, a second etch process is performed to remove the exposed portion of the first conductive layer and expose a portion of the dielectric layer. The second etch process may be a dry etch, a wet etch, or other suitable process. The second etch process may be a RIE process.

When forming the interconnect structure 200, the second etch process may be a dry etch process using $Cl_2$, $SiCl_4$, $BCl_3$, $N_2$, $O_2$, $H_2$, HBr, He, Ar, or other suitable gas. When forming the interconnect structure 200, the first etch process may be a TCP operation with a power between about 100 watts to 1800 watts. When forming the interconnect structure 200, the first etch process may be a TCP operation with a bias voltage under 300 volts.

When forming the interconnect structure 300, the second etch process may be a dry etch process using $Cl_2$, $SiCl_4$, $BCl_3$, $CF_4$, $CHF_3$, $CH_3F$, $CH_2F_2$, $C_4F_8$, $C_4F_6$, $N_2$, $O_2$, $H_2$, HBr, He, Ar, or other suitable gas. When forming the interconnect structure 300, the second etch process may be a TCP operation with a power between about 100 watts to 2000 watts. When forming the interconnect structure 300, the second etch process may be a TCP operation with a bias voltage under 800 volts.

In some embodiments, the second conductive layer and the first conductive layer have different etch selectivity in the first etch process. In some embodiments, the method 400 may further include removing the hard mask structure. Further, a dielectric fill may be formed over the exposed dielectric layer, the first conductive layer and the second conductive layer. Then, a planarization process may be performed to remove a portion of the dielectric fill, and a surface of the dielectric fill is substantially co-planar with a surface of the second conductive layer. Then, an etch stop layer may be formed over the surface of the dielectric fill and the surface of the second conductive layer.

Figure 7:
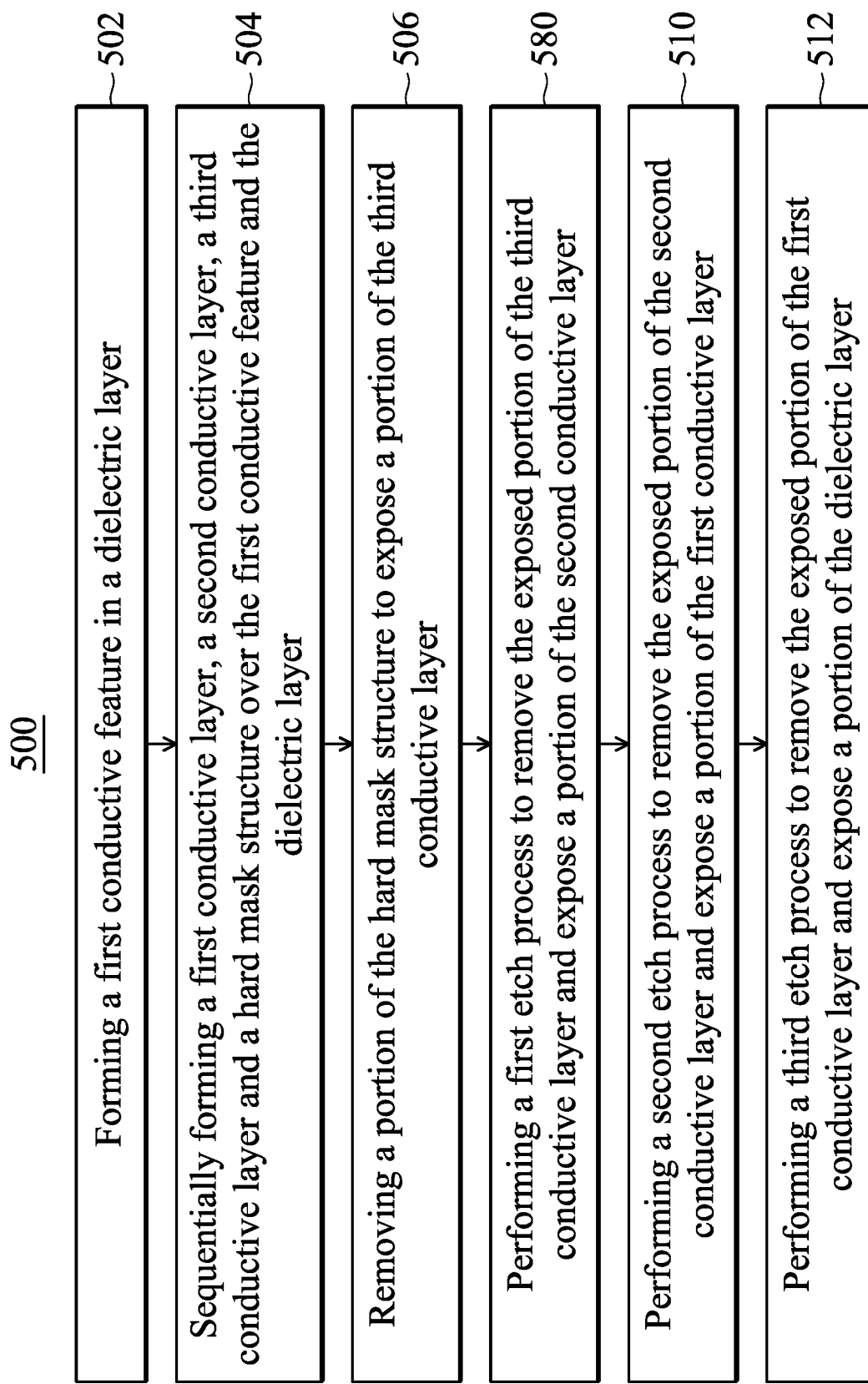
FIG. 7 is another flow chart of a method of manufacturing an interconnect structure in accordance with some embodiments.

FIG. 7 is another flow chart of a method 500 of manufacturing the interconnect structure 101 in accordance with some embodiments. It is noted that the operations of the method 500, including any descriptions given with reference to the figures, are merely exemplary and are not intended to be limiting beyond what is specifically recited in the claims that follow. Additional operations may be implemented before, during, and after the method 500, and some operations may be replaced, eliminated, or rearranged in any desired order in accordance with various embodiments of the method 500.

The method 500 starts at operation 502 by forming a first conductive feature in a dielectric layer. The first conductive feature may be the conductive feature 106 and the dielectric layer may be the dielectric material 104. The first conductive feature and the dielectric layer may be formed by the processes discussed above with respect to FIG. 3A.

At operation 504, a first conductive layer, a second conductive layer, a third conductive layer and a hard mask structure are sequentially formed over the first conductive feature and the dielectric layer. The first conductive layer, the second conductive layer and the third conductive layer may be formed by PVD, ALD, or other suitable process.

In some embodiments, the first conductive layer may be the first conductive layer 110, the second conductive layer may be the second conductive layer 112, and the third conductive layer may be the third conductive layer 114. In some embodiments, the first conductive layer may be formed by Co, Ru, Cu, Cr, Ti, V, Pd, In, alloys thereof, or other suitable material. In some embodiments, the second conductive layer may be formed by W, Mo, Os, Ir, Co, Nb, Pt, Rh, Re, alloys thereof, or other suitable material. In some embodiments, the third conductive layer may be formed by Ru, Cu, Cr, Ti, V, Pd, In, alloys thereof, or other suitable material.

The hard mask structure may be the hard mask structure 116. The hard mask structure may include a hard mask layer, a bottom layer, and a photoresist layer. In some embodiments, the hard mask layer, the bottom layer, and the photoresist layer may be the hard mask layer 118, the bottom layer 120, and the photoresist layer 122.

In some embodiments, the hard mask layer may include $SiO_2$, SiCN, Si, SiC, SiN, SiON, TiN, Al, $AlO_x$, $RuO_2$, or other suitable material. In some embodiments, the bottom layer may include a carbon-based material. In some embodiments, the bottom layer may include a carbon-containing material that is easily removed by a plasma operation. In some embodiments, the photoresist layer is used to pattern the bottom layer. In some embodiments, the bottom layer has a high etch selectivity to the hard mask layer. The hard mask structure, including the hard mask layer, the bottom layer, and the photoresist layer, allows the robust patterning of underlying layers.

At operation 506, a portion of the hard mask structure is removed to expose a portion of the third conductive layer. The removal of the portion of the hard mask structure may include multiple operations.

A patterning operation is first performed on the photoresist layer. The photoresist layer may be patterned using any suitable photolithography technique. In some embodiments, a bake or cure operation may be performed to harden the photoresist layer, and a developer may be used to remove either the exposed or unexposed portions of the photoresist layer depending on whether a positive or negative resist is used. In some embodiments, the hard mask structure may further include anti-reflective materials (e.g., a BARC layer) to aid the exposure and focus of the photoresist layer. Then, the photoresist layer is used to pattern the bottom layer, and the pattern of the photoresist layer is transferred to the bottom layer. The pattern may be transferred, for example, by one or more selective etching processes. After patterning the bottom layer, the bottom layer is used to pattern the hard mask layer. The hard mask layer may be patterned by a dry etch, a wet etch, or other suitable etch process. In some embodiments, the bottom layer has a high etch selectivity to the hard mask layer. After patterning the hard mask layer, the photoresist layer and the bottom layer are removed.

At operation 508, a first etch process is performed to remove the exposed portion of the third conductive layer and expose a portion of the second conductive layer. The first etch process may be a dry etch, a wet etch, or other suitable process. The first etch process may be a RIE process.

In some embodiments, the first etch process may be a dry etch process using $Cl_2$, $SiCl_4$, $BCl_3$, $N_2$, $O_2$, $H_2$, HBr, He, Ar, or other suitable gas. In some embodiments, the first etch process may be a TCP operation with a power between about 100 watts to 1800 watts. In some embodiments, the first etch process may be a TCP operation with a bias voltage under 300 volts.

At operation 510, a second etch process is performed to remove the exposed portion of the second conductive layer and expose a portion of the first conductive layer. The second etch process may be a dry etch, a wet etch, or other suitable process. The second etch process may be a RIE process. In some embodiments, the second etch process may be a dry etch process using $Cl_2$, $SiCl_4$, $BCl_3$, $CF_4$, $CHF_3$, $CH_3F$, $CH_2F_2$, $C_4F_8$, $C_4F_6$, $N_2$, $O_2$, $H_2$, HBr, He, Ar, or other suitable gas. In some embodiments, the second etch process may be a TCP operation with a power between about 100 watts to 2000 watts. In some embodiments, the second etch process may be a TCP operation with a bias voltage under 800 volts.

At operation 512, a third etch process is performed to remove the exposed portion of the first conductive layer and expose a portion of the dielectric layer. The third etch process may be a dry etch, a wet etch, or other suitable process. The third etch process may be a RIE process. In some embodiments, the third etch process may be a dry etch process using $Cl_2$, $SiCl_4$, $BCl_3$, $N_2$, $O_2$, $H_2$, HBr, He, Ar, or other suitable gas. In some embodiments, the third etch process may be a TCP operation with a power between about 100 watts to 1800 watts. In some embodiments, the third etch process may be a TCP operation with a bias voltage under 300 volts.

In some embodiments, the third conductive layer and the second conductive layer have different etch selectivity in the first etch process, and the second conductive layer and the first conductive layer have different etch selectivity in the second etch process.

In some embodiments, the method 500 may further include removing the hard mask structure. A dielectric fill may be formed over the exposed dielectric layer, the first conductive layer, the second conductive layer and the third conductive layer. Then, a planarization process may be performed to remove a portion of the dielectric fill, and a surface of the dielectric fill is substantially co-planar with a surface of the third conductive layer. Then, an etch stop layer may be formed over the surface of the dielectric fill and the surface of the third conductive layer.

By forming first conductive layer under the second conductive layer, the first conductive layer may perform as an etch stop layer when patterning the second conductive layer. Because the second conductive layer has a high etch selectivity to the first conductive layer when patterning the second conductive layer, and the first conductive layer has a high etch selectivity to the dielectric layer when patterning the first conductive layer, the first conductive layer may prevent the damage to the dielectric layer when forming the second conductive feature and the third conductive feature. Further, the via damage of the first conductive feature caused by the oxide recess of the dielectric layer may be also prevented.

By forming the third conductive layer above the second conductive layer, the third conductive layer may provide a protection to the second conductive layer when patterning the second conductive layer to prevent the metal line damage.

An embodiment is an interconnect structure. The interconnect structure includes dielectric layer, a first conductive feature, a second conductive feature, a third conductive feature, and a dielectric fill. The first conductive feature is disposed in the dielectric layer. The second conductive feature is disposed over the first conductive feature. The second conductive feature includes a first conductive layer disposed over the first conductive feature, a second conductive layer disposed on the first conductive layer, and a third conductive layer disposed on the second conductive layer. The first conductive layer, the second conductive layer and the third conductive layer have substantially the same width. The third conductive feature is disposed over the dielectric layer. The third conductive feature includes a fourth conductive layer disposed over the dielectric layer, a fifth conductive layer disposed on the fourth conductive layer, and a sixth conductive layer disposed on the fifth conductive layer. The fourth conductive layer, the fifth conductive layer and the sixth conductive layer have substantially the same width. The dielectric fill is disposed over the dielectric layer between the second conductive feature and the third conductive feature.

Another embodiment is a method for manufacturing an interconnection structure. A first conductive feature is formed in a dielectric layer. A first conductive layer, a second conductive layer and a hard mask structure are sequentially formed over the first conductive feature and the dielectric layer. A portion of the hard mask structure is removed to expose a portion of the second conductive layer. A first etch process is performed to remove the exposed portion of the second conductive layer and expose a portion of the first conductive layer. A second etch process is performed to remove the exposed portion of the first conductive layer and expose a portion of the dielectric layer.

A further embodiment is a method for manufacturing an interconnection structure. A first conductive feature is formed in a dielectric layer. A first conductive layer, a second conductive layer, a third conductive layer and a hard mask structure are sequentially formed over the first conductive feature and the dielectric layer. A portion of the hard mask structure is removed to expose a portion of the third conductive layer. A first etch process is performed to remove the exposed portion of the third conductive layer and expose a portion of the second conductive layer. A second etch process is performed to remove the exposed portion of the second conductive layer and expose a portion of the first conductive layer. A third etch process is performed to remove the exposed portion of the first conductive layer and expose a portion of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for manufacturing an interconnection structure, comprising:
    forming a first conductive feature in a dielectric layer;
    sequentially forming a first conductive layer, a second conductive layer, a third conductive layer, and a hard mask structure over the first conductive feature and the dielectric layer;
    removing a portion of the hard mask structure to expose a portion of the third conductive layer;
    performing a first etch process to remove the exposed portion of the third conductive layer and expose a portion of the second conductive layer;
    performing a second etch process to remove the exposed portion of the second conductive layer and expose a portion of the first conductive layer;
    performing a third etch process to remove the exposed portion of the first conductive layer and expose a portion of the dielectric layer, wherein the portion of the dielectric layer is exposed in an opening defined by a remaining portion of the hard mask structure, a remaining portion of the third conductive layer, a remaining portion of the second conductive layer, and a remaining portion of the first conductive layer;
    removing the hard mask structure;
    depositing a dielectric fill over the exposed portion of the dielectric layer, the first conductive layer, the second conductive layer, and the third conductive layer; and
    performing a planarization process to remove a portion of the dielectric fill and the third conductive layer and to expose the second conductive layer.

2. The method of claim 1, wherein the first etch process uses chlorine based etching gas and the second etch process uses fluorine based etching gas.

3. The method of claim 1, wherein the second conductive layer and the first conductive layer have different etch selectivity in the first etch process.

4. The method of claim 1, further comprising
    forming an etch stop layer over the surface of the dielectric fill and the surface of the second conductive layer.

5. The method of claim 1, wherein the first and second conductive layers comprise different materials.

6. The method of claim 5, wherein the first conductive layer comprises cobalt, ruthenium, copper, chromium, titanium, vanadium, palladium, or indium.

7. The method of claim 6, wherein the second conductive layer comprises tungsten, molybdenum, osmium, iridium, cobalt, niobium, platinum, rhodium, or rhenium.

8. The method of claim 7, wherein the first conductive layer is in contact with the conductive feature.

9. The method of claim 1, wherein a thickness of the third conductive layer is about 5 percent to about 15 percent of a total thickness of the first, second, and third conductive layers.

10. A method for manufacturing an interconnection structure, comprising:
    forming a first conductive feature in a dielectric layer;

sequentially forming a first conductive layer, a second conductive layer, a third conductive layer, and a hard mask structure over the first conductive feature and the dielectric layer;

forming an opening in the hard mask structure to expose a portion of the third conductive layer;

extending the opening in the third conductive layer to expose a portion of the second conductive layer;

extending the opening in the second conductive layer to expose a portion of the first conductive layer;

extending the opening in the first conductive layer to expose a portion of the dielectric layer;

removing the hard mask structure;

forming a dielectric fill in the opening, wherein the dielectric fill is in contact with the third conductive layer, the second conductive layer, and the first conductive layer; and performing a planarization process to remove a portion of the dielectric fill and the third conductive layer, wherein a surface of the dielectric fill is substantially co-planar with a surface of the second conductive layer.

11. The method of claim 10, wherein the hard mask structure is a multiple-layer stack structure comprising a hard mask layer, a bottom layer, and a photoresist layer.

12. The method of claim 10, wherein the third conductive layer and the second conductive layer have different etch selectivity in the first etch process.

13. The method of claim 10, wherein the second conductive layer and the first conductive layer have different etch selectivity in the second etch process.

14. The method of claim 10, further comprising:
performing a planarization process to remove a portion of the dielectric fill, wherein a surface of the dielectric fill is substantially co-planar with a surface of the third conductive layer.

15. The method of claim 14, further comprising:
forming an etch stop layer over the surface of the dielectric fill and the surface of the third conductive layer.

16. The method of claim 10, further comprising forming an etch stop layer over the surface of the dielectric fill and the surface of the second conductive layer.

17. The method of claim 10, wherein a thickness of the third conductive layer is about 5 percent to about 15 percent of a total thickness of the first, second, and third conductive layers.

18. A method for manufacturing an interconnection structure, comprising:
forming a first conductive feature in a dielectric layer; and
forming a second conductive feature on the first conductive feature, comprising:
depositing a first conductive layer on the first conductive feature and the dielectric layer;
depositing a second conductive layer on the first conductive layer;
depositing a third conductive layer on the second conductive layer;
forming a hard mask layer over the third conductive layer;
performing a first etch process to remove a portion of the hard mask layer to expose a portion of the second conductive layer;
performing a second etch process to remove the exposed portion of the second conductive layer to expose a portion of the first conductive layer, wherein the second conductive layer has an etch selectivity higher than eight to the first conductive layer during the second etch process; and
performing a third etch process to remove the exposed portion of the first conductive layer to expose at least a portion of the dielectric layer;
depositing a dielectric fill over the dielectric layer and the second conductive feature; and
performing a planarization process to remove a portion of the dielectric fill and the third conductive layer and to expose the second conductive layer.

19. The method of claim 18, further comprising forming an etch stop layer on the dielectric fill and the second conductive layer.

20. The method of claim 18, wherein a thickness of the third conductive layer is about 5 percent to about 15 percent of a total thickness of the first, second, and third conductive layers.

* * * * *